(12) United States Patent
 I et al.

(10) Patent No.: US 10,375,846 B2
(45) Date of Patent: Aug. 6, 2019

(54) HOUSING HAVING HOUSING PARTS BONDABLE TOGETHER AND METHOD OF MANUFACTURING THE SAME

(71) Applicants: LITE-ON ELECTRONICS (GUANGZHOU) LIMITED, Guangzhou (CN); LITE-ON TECHNOLOGY CORP., Taipei (TW)

(72) Inventors: Ya-Tung I, Taipei (TW); Chien-Hua Chu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 39 days.

(21) Appl. No.: 15/723,376

(22) Filed: Oct. 3, 2017

(65) Prior Publication Data
US 2018/0206349 A1    Jul. 19, 2018

(30) Foreign Application Priority Data

Jan. 13, 2017 (CN) .......................... 2017 1 0025910

(51) Int. Cl.
*H05K 5/02* (2006.01)
*H05K 5/06* (2006.01)
(Continued)

(52) U.S. Cl.
CPC ............. *H05K 5/066* (2013.01); *B23K 20/10* (2013.01); *B29C 65/08* (2013.01); *B29C 66/1222* (2013.01); *B29C 66/1224* (2013.01); *B29C 66/1282* (2013.01); *B29C 66/12445* (2013.01); *B29C 66/12469* (2013.01); *B29C 66/12841* (2013.01); *B29C 66/30221* (2013.01); *B29C 66/30223* (2013.01); *B29C 66/322* (2013.01); *B29C 66/54* (2013.01); *B29C 66/7392* (2013.01); *B23K 2101/045* (2018.08);
(Continued)

(58) Field of Classification Search
CPC .......... B29C 66/1222; B29C 66/12445; B29C 66/1282; B29C 66/12841; B29C 66/30221; B29C 66/30223; B29C 66/12469
See application file for complete search history.

(56) References Cited

U.S. PATENT DOCUMENTS 3,819,437 A * 6/1974 Paine ...................... B29C 65/08
                                                156/73.4
5,782,370 A * 7/1998 Kamiya ............... H05K 9/0067
                                                220/284
(Continued)

*Primary Examiner* — Hoa C Nguyen
*Assistant Examiner* — Keith DePew
(74) *Attorney, Agent, or Firm* — Rosenberg, Klein & Lee

(57) ABSTRACT

A housing includes a first surrounding wall connected around a base wall. The first surrounding wall has a first joint portion opposite to the base wall, a first outer surface and a first inner surface. The first outer and inner surfaces extend from the first joint portion toward the base wall. The first joint portion is stepped and has a first projecting portion adjoining the first outer surface, and a first shoulder portion indented from the first projecting portion and proximal to the first inner surface. The first shoulder portion has a plurality of parallel spaced-apart ribs protruding therefrom in a same direction as the first projecting portion. Each of the ribs has a tip that does not extend beyond a top end of the first projecting portion.

17 Claims, 12 Drawing Sheets

(51) Int. Cl.
  *B23K 20/10* (2006.01)
  *B29C 65/08* (2006.01)
  *B29C 65/00* (2006.01)
  *B29L 31/34* (2006.01)
  *B23K 101/04* (2006.01)
  *B23K 101/36* (2006.01)

(52) U.S. Cl.
  CPC ...... *B23K 2101/36* (2018.08); *B29C 66/8322* (2013.01); *B29L 2031/3481* (2013.01)

(56) References Cited

U.S. PATENT DOCUMENTS

| | | | | |
|---|---|---|---|---|
| 6,927,335 B2* | 8/2005 | Lim | ............... | H02G 3/081 |
| | | | | 174/50 |
| 8,695,797 B2* | 4/2014 | Maier | ............... | H05K 5/0013 |
| | | | | 206/320 |
| 9,434,839 B2* | 9/2016 | Sakata | ............... | C08L 67/02 |
| 2004/0060364 A1* | 4/2004 | Roeckel | ............... | B29C 65/0636 |
| | | | | 73/861 |
| 2008/0053700 A1* | 3/2008 | O'Connor | ............... | B23K 20/122 |
| | | | | 174/564 |
| 2008/0278045 A1* | 11/2008 | Fan | ............... | H05K 5/066 |
| | | | | 312/223.6 |
| 2008/0278892 A1* | 11/2008 | Chen | ............... | H05K 5/063 |
| | | | | 361/724 |
| 2012/0135300 A1* | 5/2012 | Ota | ............... | H01M 2/1061 |
| | | | | 429/176 |
| 2013/0050966 A1* | 2/2013 | Frenzel | ............... | B29C 66/9292 |
| | | | | 361/759 |
| 2013/0336710 A1* | 12/2013 | Chou | ............... | B29C 65/08 |
| | | | | 403/270 |
| 2015/0014006 A1* | 1/2015 | Hozumi | ............... | H01H 9/04 |
| | | | | 173/46 |
| 2016/0114550 A1* | 4/2016 | Torriani | ............... | B29C 66/30223 |
| | | | | 428/76 |
| 2016/0167288 A1* | 6/2016 | Rodgers | ............... | B29C 65/08 |
| | | | | 156/73.1 |
| 2016/0184933 A1* | 6/2016 | Armstrong | ............... | B23K 1/0008 |
| | | | | 220/4.01 |
| 2016/0271868 A1* | 9/2016 | Ono | ............... | B29C 66/30221 |
| 2017/0093077 A1* | 3/2017 | Kwan | ............... | H01R 13/504 |
| 2018/0022039 A1* | 1/2018 | Jian | ............... | B29C 65/06 |
| | | | | 428/220 |

* cited by examiner

HOUSING HAVING HOUSING PARTS BONDABLE TOGETHER AND METHOD OF MANUFACTURING THE SAME

CROSS-REFERENCE TO RELATED APPLICATION

This application claims priority to Chinese Patent Application No. 201710025910.9, filed on Jan. 13, 2017.

FIELD

The disclosure relates to a housing, and more particularly to a housing suitable for an electronic device and a method of manufacturing the same.

BACKGROUND

To meet the power specifications of different electronic products, various electronic devices, such as power adapters, power transformers and power connectors have been provided in the art. In such electronic devices, a housing is used as a covering to isolate interior electronic elements from dust or mist or from being contacted by a user.

Referring to FIGS. 1 to 4, an existing housing includes a first housing part 1 and a second housing part 2 coupled with the first housing part 1. The first housing part 1 includes a first joint portion 11, a first outer surface 12 and a first inner surface 13. The first outer and inner surfaces 12, 13 extend from the first joint portion 11. The first joint portion 11 is stepped and has a first projecting portion 112 adjoining the first inner surface 13, and a first shoulder portion 111 indented from the first projecting portion 112 and proximal to the first outer surface 12. The first projecting portion 112 has a plurality of linearly aligned and spaced-apart ribs 113 protruding therefrom. The ribs 113 are equidistantly spaced apart from each other and form a welding line (L1) continuously extending parallel with the outer surface 12. The second housing part 2 includes a second joint portion 21, a second outer surface 22 and a second inner surface 23. The second outer and inner surfaces 22, 23 extend from the second joint portion 21. The second joint portion 21 has a second projecting portion 211, a second shoulder portion 212 and an inner projecting portion 213. The second projecting portion 211 adjoins the second outer surface 22. The inner projecting portion 213 adjoins the second inner surface 23. The second shoulder portion 212 is indented between the second and inner projecting portions 211, 213. The first and second joint portions 11, 21 are interlockable with each other.

When the first and second housing halves 1, 2 are coupled with each other, the first shoulder portion 111 is in contact with the second projecting portion 211, and the ribs 113 are in contact with the second shoulder 212. By ultrasonic welding, the ribs 113 are formed into a bonding layer between the first projecting portion 112 and the second shoulder portion 212, thereby bonding the first joint portion 11 to the second joint portion 21.

Each rib 113 is a triangular prism, and is tapered away from a surface of the first projecting portion 112. In order to increase the coupling strength of the first and second housing halves 1, 2 so as to pass the drop and falling ball tests, the ribs 113 have to be melted as efficient as possible during ultrasonic welding to increase the adhesion strength of the first and second housing halves 1, 2. However, when the ribs 113 are melted, because each rib 113 is relatively large in width or cross section, especially near a seam between the first and second housing parts 1, 2, each rib 113 produces a relatively large amount of melt. The melt is liable to overflow through the seam due to vigorous vibration caused by ultrasonic wave, thereby adversely affecting the aesthetic appearance and yield rate of production.

When the amount of the melt is reduced to avoid the problem of melt overflow, adhesion between the first and second housing halves 1, 2 is insufficient. During the drop and falling ball tests, because the welding line (L1) is continuous, even a small break in the welded joint can cause the welded joint to split entirely, thereby resulting in test failure.

SUMMARY

Therefore, an object of the disclosure is to provide a housing that can avoid welding melt from overflowing during manufacturing and that satisfies the requirements of drop and falling ball tests.

According to the disclosure, a housing includes a first housing part that includes a first base wall and a first surrounding wall connected around the first base wall.

The first surrounding wall has a first joint portion configured for being processed by melt bonding, a first outer surface and a first inner surface. The first joint portion is opposite to the base wall. The first outer and inner surfaces extend from the first joint portion toward the base wall. The first joint portion is stepped and has a first projecting portion adjoining the first outer surface, and a first shoulder portion indented from the first projecting portion and proximal to the first inner surface. The first shoulder portion has a plurality of parallel spaced-apart ribs protruding therefrom in a same direction as the first projecting portion. Each of the ribs has a tip that does not extend beyond a top end of the first projecting portion.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
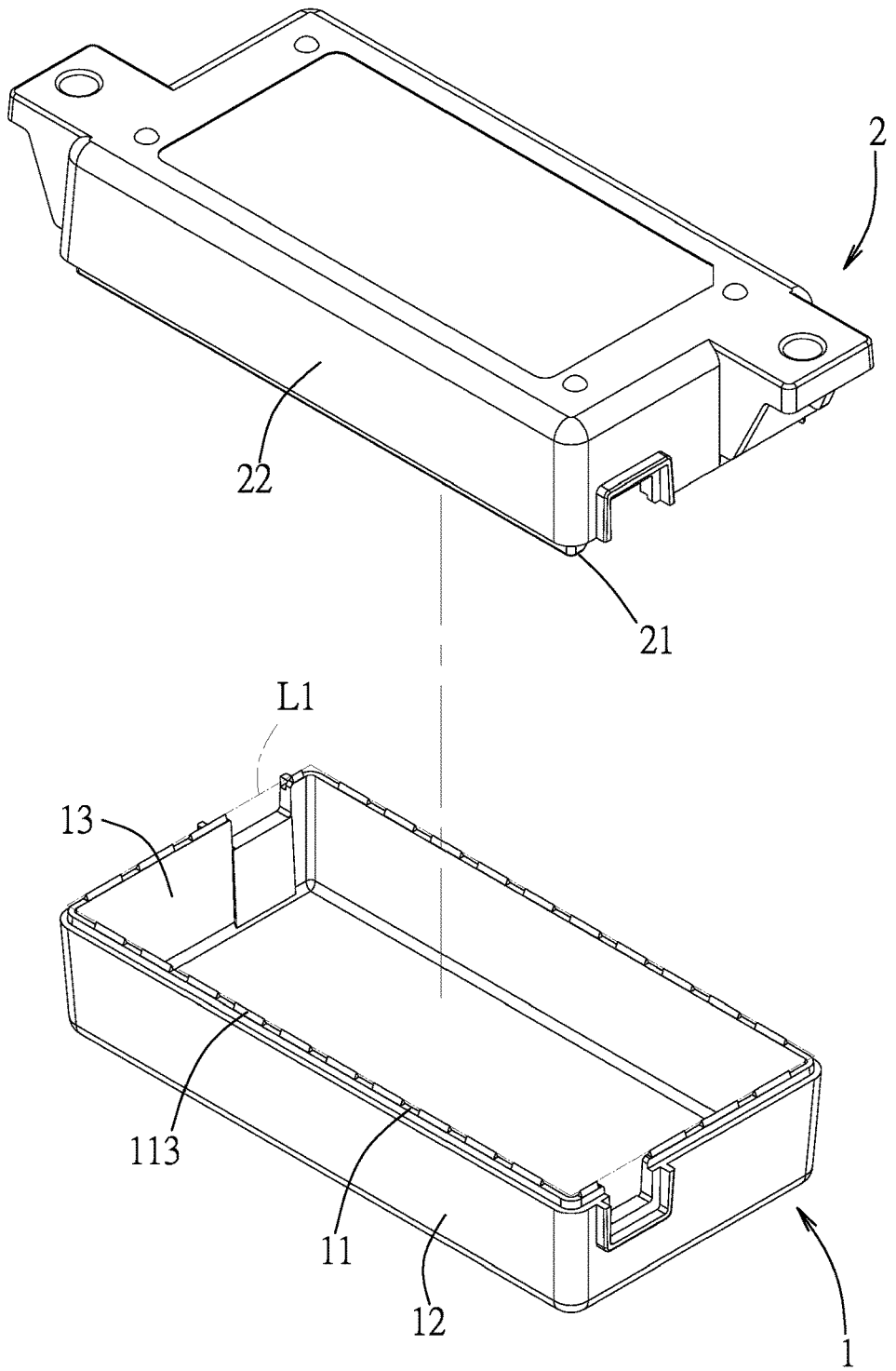
FIG. 1 is an exploded view of an existing housing that includes first and second housing halves.
Figure 2:
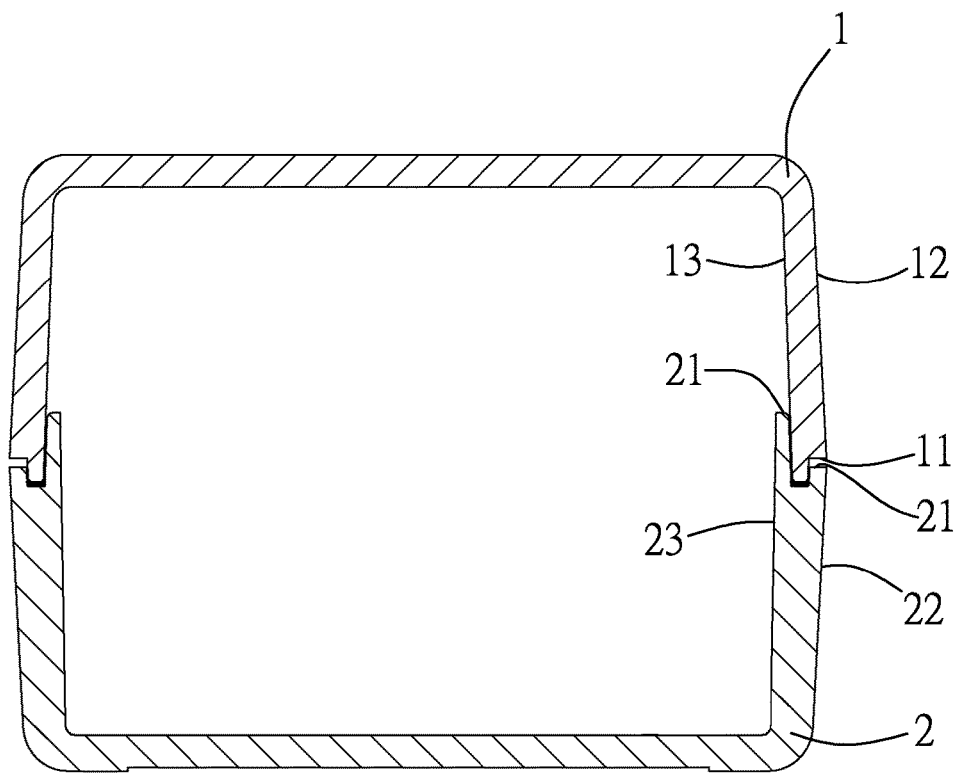
FIG. 2 is a sectioned view of the existing housing.
Figure 3:
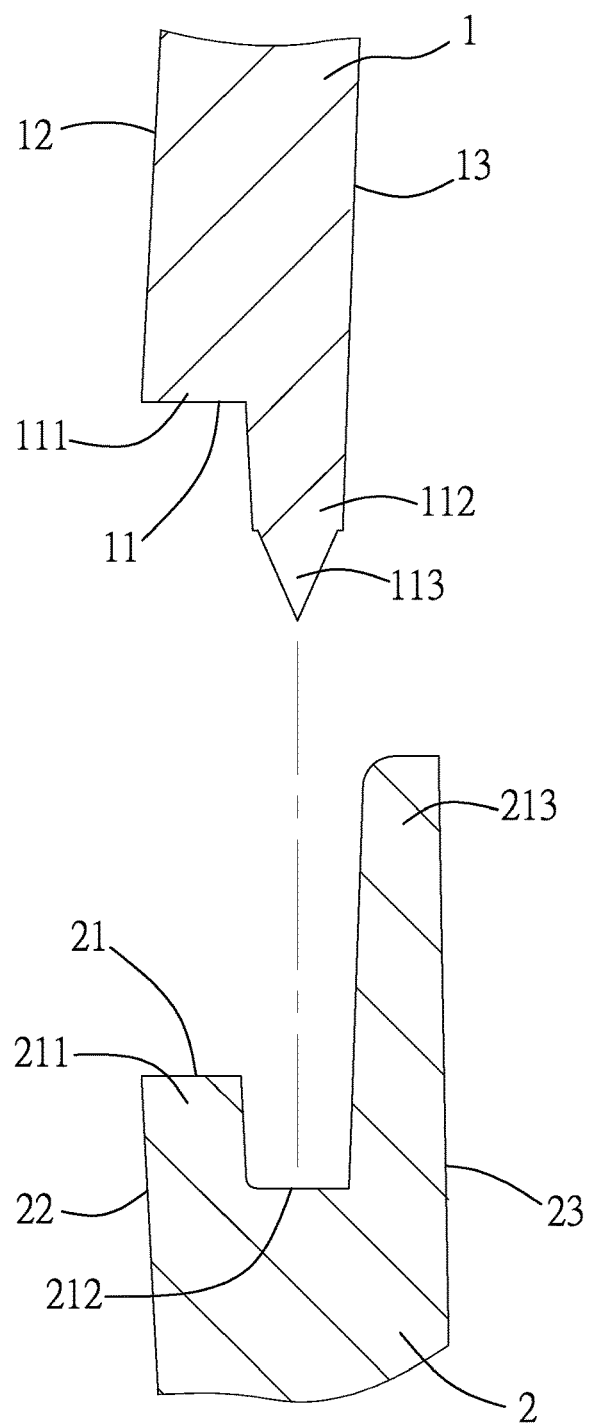
FIG. 3 is an enlarged fragmentary sectional view, illustrating first and second joint portions of the first and second housing halves of the existing housing.
Figure 4:
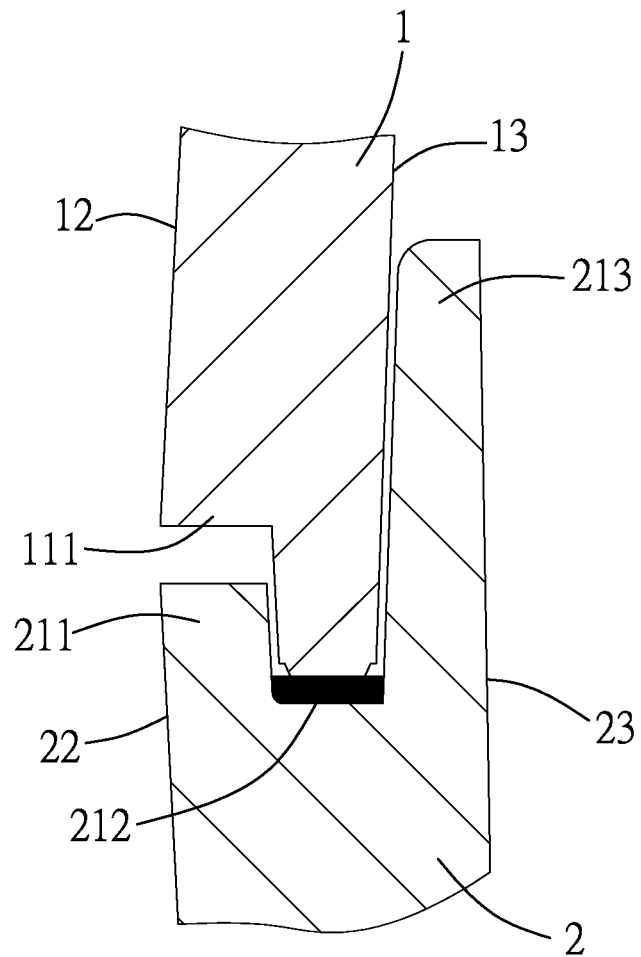
FIG. 4 is an enlarged fragmentary sectional view, illustrating that the first and second housing halves of the existing housing are coupled with each other.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 5:
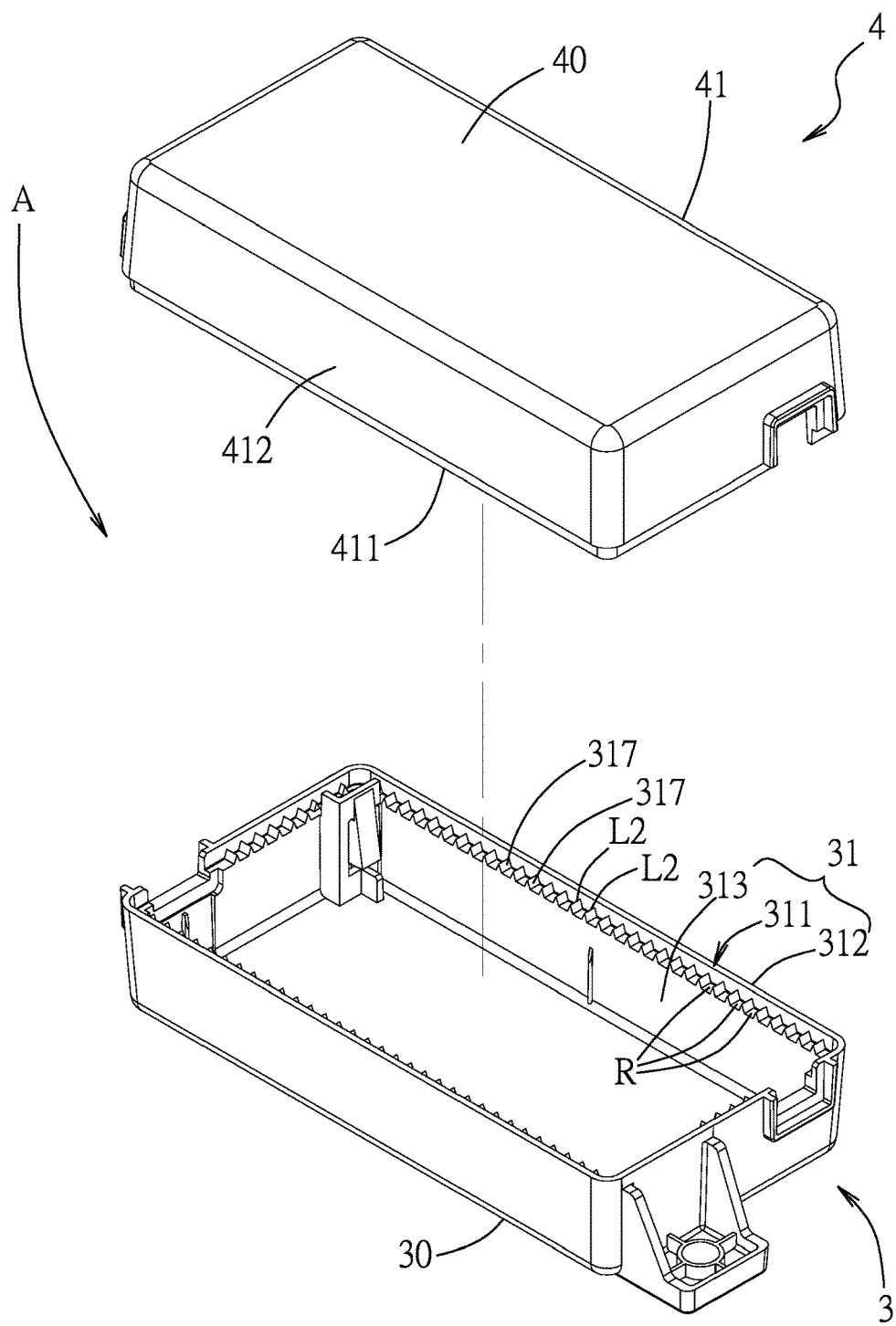
FIG. 5 is an exploded view, illustrating a housing according to a first embodiment of the present disclosure that includes first and second housing parts.
Figure 6:
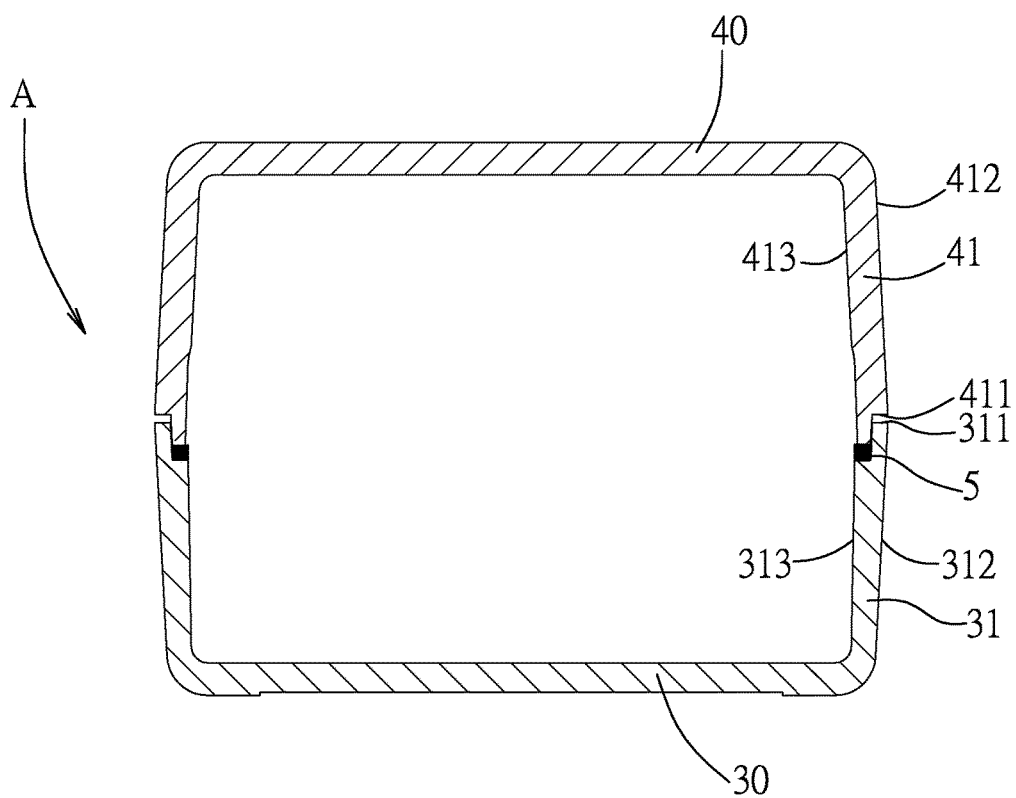
FIG. 6 is a sectional view of the housing of the first embodiment.
Figure 7:
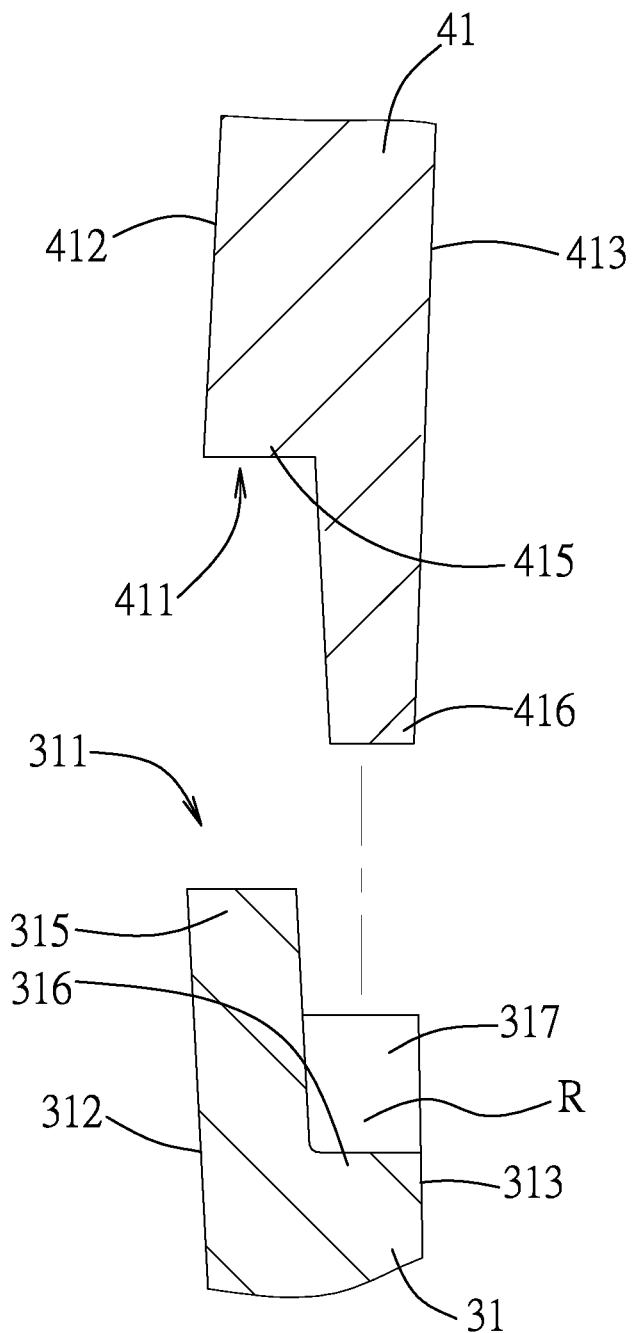
FIG. 7 is an enlarged fragmentary sectional view, illustrating first and second joint portions of the first and second housing parts of the first embodiment.

Referring to FIGS. 5 to 7, a housing (A) according to a first embodiment of the present disclosure includes a first housing part 3 and a second housing part 4 for coupling with the first housing part 3.

The first housing part 3 includes a first base wall 30 and a first surrounding wall 31 connected around the first base wall 30. In this embodiment, the first surrounding wall 31 is four-sided, and has a first joint portion 311 configured for being processed by ultrasonic welding, a first outer surface 312 and a first inner surface 313. The first joint portion 311 is disposed away from the first base wall 30. The first inner surface 313 is opposite to the first outer surface 312. The first outer and inner surfaces 312, 313 extend from the first joint portion 311 toward the base wall 30. In this embodiment, the first joint portion 311 is stepped and has a first projecting portion 315 adjoining the first outer surface 312, and a first shoulder portion 316 indented from the first projecting portion 315 and proximal to the first inner surface 313.

The second housing part 4 is substantially identical to the first housing part 3, and includes a second base wall 40 and a second surrounding wall 41 connected around the second base wall 40. The second surrounding wall 41 has a second joint portion 411 for joining with the first joint portion 311 of the first surrounding wall 31, a second outer surface 412 and a second inner surface 413. The second joint portion 411 is disposed away from the second base wall 40. The second inner surface 413 is opposite to the second outer surface 412. The second outer and inner surfaces 412, 413 extend from the second joint portion 411 toward the second base wall 40. The second joint portion 411 is stepped and has a second projecting portion 416 adjoining the second inner surface 413, and a second shoulder portion 415 indented from the second projecting portion 416 and adjoining the second outer surface 412. The second shoulder portion 415 and the second projecting portion 416 respectively face the first projecting portion 315 and the first shoulder portion 316.

In this embodiment, the first shoulder portion 316 has a plurality of spaced-apart ribs 317 protruding therefrom in a same direction as the first projecting portion 315. Preferably, the ribs 317 are parallel, equidistantly spaced apart from each other, and are substantially perpendicular or transverse to the first inner surface 313. Each of the ribs 317 has a wide bottom and a narrow top, is elongated perpendicularly to the first inner surface 313, and is tapered in a direction away from a surface of the first shoulder portion 316. In this embodiment, each of the ribs 317 is, but is not limited to, a triangular prism. Each of the ribs 317 has a tip that does not extend beyond a top end of the first projecting portion 315. Besides, each rib 317 is meltable to form into a welding line (L2) that is substantially perpendicular to the first inner surface 313. Further, two adjacent ones of the ribs 317 and the surface of the first shoulder portion 316 cooperatively define a recess (R). Preferably, the welding lines (L2) of the ribs 317 are parallel and equidistantly spaced apart from each other along the first shoulder portion 316.

Figure 8:
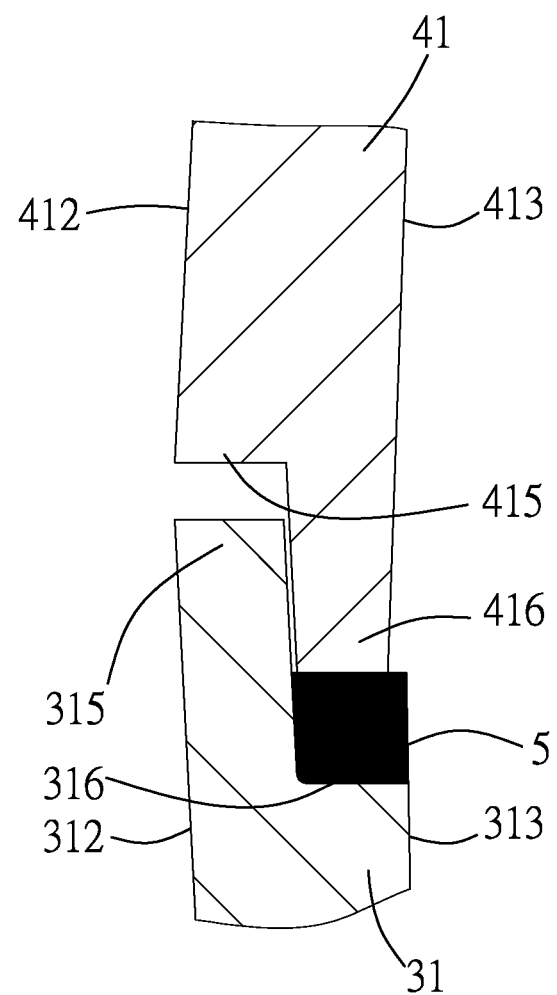
FIG. 8 is an enlarged fragmentary sectional view of the first embodiment, illustrating that the first and second housing parts are coupled with each other.
Figure 9:
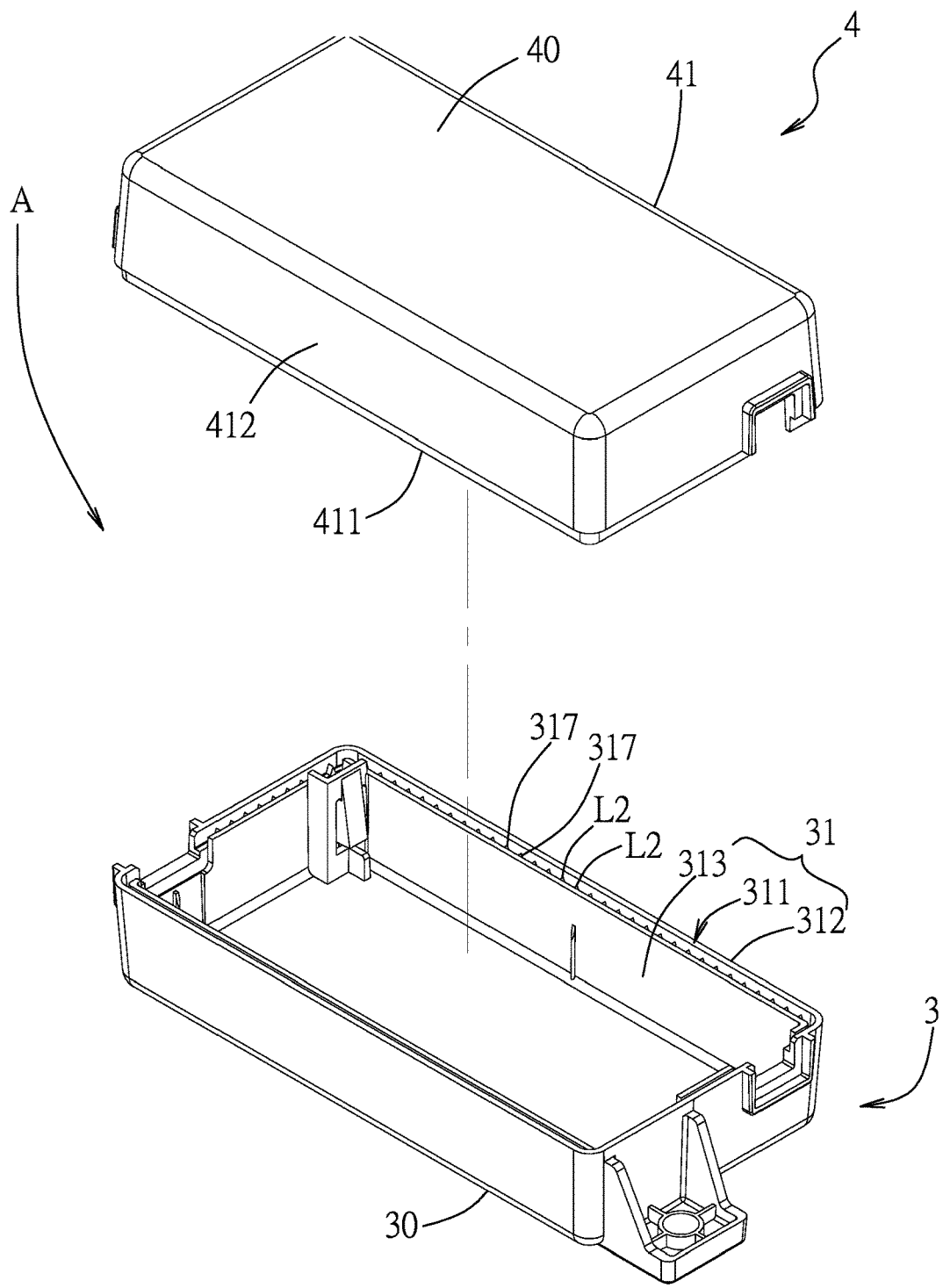
FIG. 9 is an exploded view, illustrating a housing according to a second embodiment of the present disclosure that includes first and second housing parts.
Figure 10:
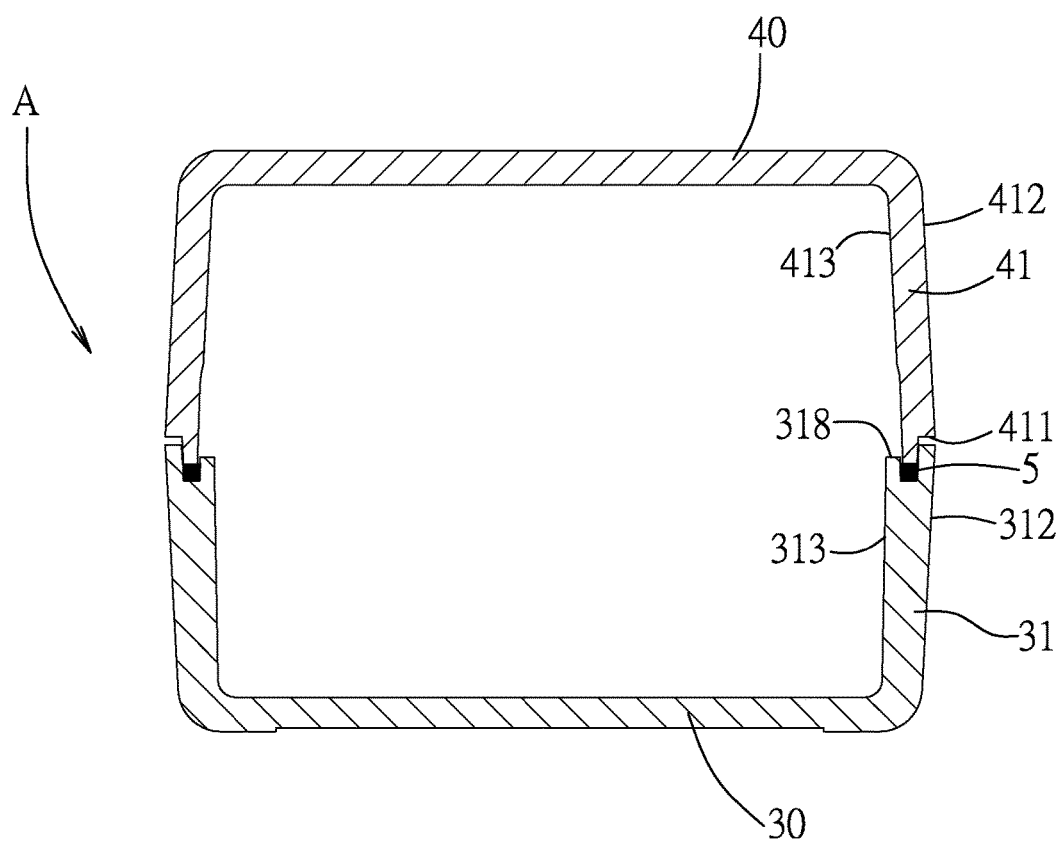
FIG. 10 is a sectional view of the housing of the second embodiment.
Figure 11:
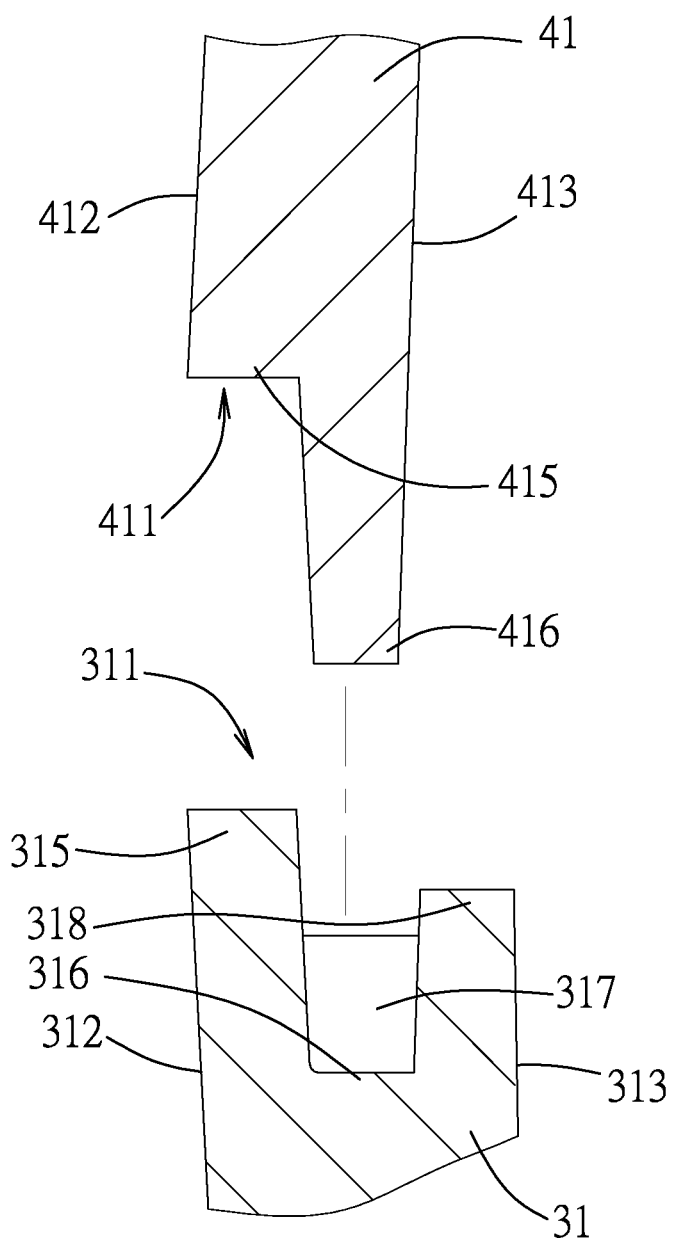
FIG. 11 is an enlarged fragmentary sectional view, illustrating first and second joint portions of the first and second housing parts of the second embodiment.
Figure 12:
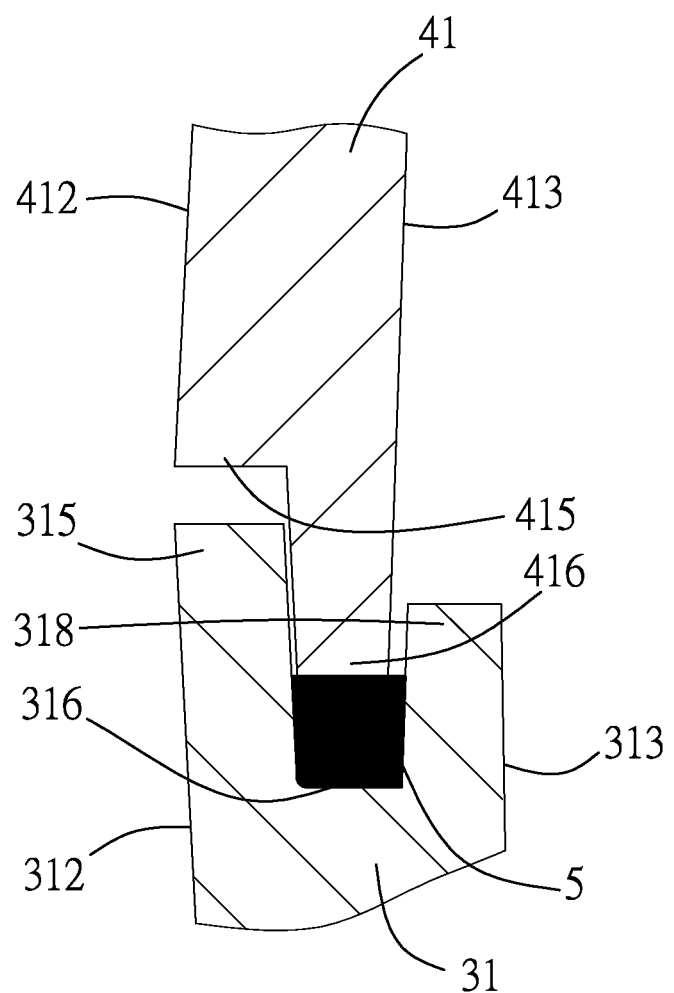
FIG. 12 is an enlarged fragmentary sectional view of the first embodiment, illustrating that the first and second housing parts are coupled with each other.

Referring to FIG. 8, in combination with FIGS. 5 to 7, in a method of manufacturing the housing (A), the first and second housing parts 3, 4 are brought together by interlocking the first and second join portions 311, 411 such that the second shoulder portion 415 is placed in contact with the first projecting portion 315 and the second projecting portion 416 is placed in contact with the ribs 317. When the first joint portion 311 is melt bonded to the second joint portion 411, for example, by ultrasonic welding, ultrasonic wave vibrations cause the first and second joint portions 311, 411 to rub and friction each other, producing melt from the ribs 317 to form a bonding layer 5 between the second projecting portion 416 and the first shoulder portion 316. As a result, the first shoulder portion 316 and the second projecting portion 416 are adhered to each other by the bonding layer 5, and the first and second housing parts 3, 4 are coupled with each other to form the housing (A). Because the ribs 317 are formed at the first shoulder portion 316 and because each rib 317 has its narrow end disposed higher than its wide end as shown in FIGS. 5 and 7, when the ribs 317 are melted, even if the amount of the melt is large, the melt will first flow downward into the recesses (R) until it entirely covers the surface of the first shoulder portion 316, and thereafter rises along the inner surface of the first projecting portion 315. In addition, because each rib 317 has a relatively small width or cross section in comparison with the existing housing of the prior art (see FIGS. 1 to 4), the melt produced from each rib 317 will not overflow through the seam of the first and second joint portions 311, 411 and spoil the aesthetic appearance of the housing (A). Compared to the prior art shown in FIGS. 1 to 4, the housing (A) of the embodiment may be manufactured at an increased production yield rate. Further, because the tips of the ribs 317 are substantially parallel and perpendicular to the first inner surface 313, the welding lines (L2) of the ribs 317 are parallel and spaced apart, and are discontinuous. Therefore, even if there is a small break at the welded seam, the housing (A) will not split and will be able to pass the drop and falling ball tests.

Although the ribs 317 are disposed on all four sides of the first joint portion 311 in this embodiment, as an alternative, the ribs 317 may be disposed at least on two sides, for example, on two opposite sides of the first joint portion 311.

FIGS. 9 to 12 illustrate a housing (A) according to a second embodiment of the present disclosure, which is structurally similar to that of the first embodiment. However, in the second embodiment, the first joint portion 311 further has an inner projecting portion 318 projecting between the first shoulder portion 316 and the first inner surface 313. The ribs 317 are formed between the first projecting portion 315 and the inner projecting portion 318, and the tip of each rib 317 does not extend beyond a top end of the inner projection portion 318. Unlike the first embodiment, the second embodiment utilizes the inner projecting portion 318 to prevent excessive melt of the ribs 317 from overflowing to the first inner surface 313. The structural strength of the housing (A) of the second embodiment may therefore be increased.

It is worth mentioning that the first housing part 3 per se has a unique structure and may be manufactured and sold independently. The first housing part 3 is usable with any other suitable second housing part 4 that is connectable to the first joint portion 311.

To sum up, because the ribs 317 are formed on the first shoulder portion 316, and because the welding lines (L2)

formed from the ribs 317 are substantially parallel and perpendicular to the first inner surface 313 and are discontinuous, during welding, even if the amount of the melt of the ribs 317 is large, the melt will first flow downward into the recesses (R) until it entirely covers the surface of the first shoulder portion 316. The melt will rise only after the melt entirely covers the first shoulder portion 316 and will not overflow. Therefore, the structural strength of the housing (A) is enhanced, and the overflowing problem, which affects the aesthetic appearance of the housing (A), is avoided. Further, the yield rate of welding the housing (A) is improved. In addition, in case of a small break occurring in the welded joint, the break would not cause an entire separation of the housing (A), and the housing (A) is still able to pass the drop and falling ball tests.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A housing, comprising:
    a first housing part including:
        a first base wall, and
        a first surrounding wall connected around the first base wall, and having a first joint portion configured for being processed by melt bonding, a first outer surface and a first inner surface, the first joint portion being opposite to the base wall, the first outer and inner surfaces extending from the first joint portion toward the base wall, the first joint portion being stepped and having a first projecting portion adjoining the first outer surface, and a first shoulder portion indented from the first projecting portion and proximal to the first inner surface, the first shoulder portion having a plurality of parallel ribs protruding from a longitudinally extended section thereof, the ribs being spaced-apart longitudinally along the longitudinally extended section of the first shoulder portion to each extend in a transverse direction across the longitudinally extended section, each of the ribs having a tip that does not extend beyond a top end of the first projecting portion.

2. The housing as claimed in claim 1, further comprising a second housing part for coupling with the first housing part, the second housing part including a second base wall and a second surrounding wall connected around the second base wall, the second surrounding wall having a second joint portion for joining with the first joint portion, a second outer surface and a second inner surface, the second joint portion being opposite to the second base wall, the second outer and inner surfaces extending from the second joint portion toward the second base wall, the second joint portion being stepped and having a second projecting portion adjoining the second inner surface, and a second shoulder portion indented from the second projecting portion and adjoining the second outer surface, the first and second joint portions being interlockable with each other to place the second shoulder portion in contact with the first projecting portion and to place the second projecting portion in contact with the ribs.

3. The housing as claimed in claim 2, wherein the ribs are parallel and spaced apart from each other and are transverse to the first inner surface adjacent the longitudinally extended section of the first shoulder portion.

4. The housing as claimed in claim 2, wherein each of the ribs is tapered in a direction away from a surface of the first shoulder portion.

5. The housing as claimed in claim 4, wherein each of the ribs is a triangular prism.

6. The housing as claimed in claim 4, wherein the ribs are meltable to form a bonding layer between the first shoulder portion and the second projecting portion.

7. The housing as claimed in claim 6, wherein the ribs are meltable when being subjected to ultrasonic welding.

8. The housing as claimed in claim 2, wherein the first joint portion further has an inner projecting portion transversely extending between the first shoulder portion and the first inner surface, the ribs being formed between the first projecting portion and the inner projecting portion, the tip of each of the ribs being not extending beyond a top end of the inner projection portion.

9. The housing as claimed in claim 8, wherein the first surrounding wall and the first joint portion are four-sided, the ribs being disposed on at least two sides of the first joint portion.

10. The housing as claimed in claim 1, wherein the ribs are parallel and spaced apart from each other and are transverse to the first inner surface adjacent the longitudinally extended section of the first shoulder portion.

11. The housing as claimed in claim 1, wherein each of the ribs is tapered in a direction away from a surface of the first shoulder portion.

12. The housing as claimed in claim 11, wherein each of the ribs is a triangular prism.

13. The housing as claimed in claim 1, wherein the first joint portion further has an inner projecting portion projecting between the first shoulder portion and the first inner surface, the ribs being formed between the first projecting portion and the inner projecting portion, the tip of each of the ribs being not extending beyond a top end of the inner projection portion.

14. The housing as claimed in claim 1, wherein the first surrounding wall and the first joint portion are four-sided, the ribs being disposed on at least two sides of the first joint portion.

15. A method for manufacturing a housing, comprising:
    providing a first housing part that includes:
        a first base wall, and
        a first surrounding wall connected around the first base wall, and having a first joint portion, a first outer surface and a first inner surface, the first joint portion being opposite to the base wall, the first outer and inner surfaces extending from the first joint portion toward the base wall, the first joint portion being stepped and having a first projecting portion adjoining the first outer surface, and a first shoulder portion proximal to the first inner surface and indented from the first projecting portion, the first shoulder portion having a plurality of parallel ribs protruding from a longitudinally extended section thereof, the ribs being spaced-apart longitudinally along the longitudinally extended section of the first shoulder portion to each extend in a transverse direction across the longitudinally extended section, each of the rib having a tip that does not extend beyond a top end of the first projecting portion;

providing a second housing part that includes a second base wall, a second surrounding wall connected around the second base wall, the second surrounding wall having a second joint portion, a second outer surface and a second inner surface, the second joint portion being opposite to the second base wall, the second outer and inner surfaces extending from the second joint portion toward the second base wall, the second joint portion being stepped and having a second projecting portion adjoining the second inner surface, and a second shoulder portion indented from the second projecting portion and adjoining the second outer surface; and bring together joining the first and second housing parts, which includes interlocking the first joint portion with the second joint portion such that the second shoulder portion is placed in contact with the first projecting portion and the second projecting portion is placed in contact with the ribs.

16. The method of claim 15, wherein the joining of the first and second housing parts further includes melt-bonding the first joint portion to the second joint portion so that the ribs are formed into a bonding layer between the second projecting portion and the first shoulder portion.

17. The method of claim 16, wherein the melt-bonding is carried out by ultrasonic welding.

\* \* \* \* \*